（12）United States Patent
Chen

(10) Patent No.: US 10,610,015 B2
(45) Date of Patent: Apr. 7, 2020

(54) SLIDE RAIL DEVICE WITH UNLOCKING STRUCTURE FOR MIDDLE SLIDE RAIL

(71) Applicant: MARTAS PRECISION SLIDE CO., LTD., New Taipei (TW)

(72) Inventor: Wan-Lai Chen, New Taipei (TW)

(73) Assignee: MARTAS PRECISION SLIDE CO., LTD., New Taipei (TW)

( * ) Notice: Subject to any disclaimer, the term of this patent is extended or adjusted under 35 U.S.C. 154(b) by 0 days.

(21) Appl. No.: 16/135,019

(22) Filed: Sep. 19, 2018

(65) Prior Publication Data

US 2019/0082836 A1 Mar. 21, 2019

(30) Foreign Application Priority Data

Sep. 20, 2017 (TW) .............................. 106132274 A

(51) Int. Cl.
| A47B 88/00 | (2017.01) |
| A47B 88/473 | (2017.01) |
| F16C 29/04 | (2006.01) |
| A47B 88/487 | (2017.01) |
| F16C 29/10 | (2006.01) |
| A47B 88/49 | (2017.01) |
| H05K 7/14 | (2006.01) |
| A47B 88/57 | (2017.01) |
| A47B 21/03 | (2006.01) |

(52) U.S. Cl.
CPC .......... *A47B 88/473* (2017.01); *A47B 88/487* (2017.01); *A47B 88/49* (2017.01); *A47B 88/57* (2017.01); *F16C 29/04* (2013.01); *F16C 29/045* (2013.01); *F16C 29/048* (2013.01); *F16C 29/10* (2013.01); *H05K 7/1489* (2013.01); *A47B 21/03* (2013.01); *F16C 2314/72* (2013.01)

(58) Field of Classification Search
CPC ..... A47B 88/493; A47B 88/487; A47B 88/49; A47B 88/57; A47B 88/473; H05K 7/1489
See application file for complete search history.

(56) References Cited

U.S. PATENT DOCUMENTS

| 7,029,080 | B2 * | 4/2006 | Barry, Jr. ............. | H05K 7/1489 312/333 |
| 8,585,164 | B2 * | 11/2013 | Chen ...................... | A47B 88/49 312/333 |
| 9,538,845 | B1 * | 1/2017 | Chen ...................... | A47B 88/49 |
| 10,041,535 | B2 * | 8/2018 | Chen ...................... | F16C 29/10 |
| 10,213,017 | B2 * | 2/2019 | Chen ...................... | H05K 7/1489 |

(Continued)

*Primary Examiner* — Kimberley S Wright
(74) *Attorney, Agent, or Firm* — Li & Cai Intellectual Property (USA) Office

(57) ABSTRACT

A slide rail device with an unlocking structure for a middle slide rail includes an outer slide rail mounted on a fixing member, and an inner slide rail mounted on a side wall of a movable member. The inner slide rail is coupled to the outer slide rail to enable a middle slide rail to be disposed between the outer slide rail and the inner slide rail. A ball bearing unit is disposed between the middle slide rail and the inner slide rail. A releasing element is movably disposed on the middle slide rail and arranged between the ball bearing unit and the elastic locking element. When the inner slide rail and the movable member are removed from the slide rail device, the releasing element is pushed by the ball bearing unit and pushes an elastic locking element to unlock the middle slide rail.

14 Claims, 10 Drawing Sheets

(56) References Cited

U.S. PATENT DOCUMENTS

| | | | | |
|---|---|---|---|---|
| 2011/0135224 A1* | 6/2011 | Chen | ............. | F16C 29/04 |
| | | | | 384/26 |
| 2012/0308297 A1* | 12/2012 | Chen | ............. | A47B 88/49 |
| | | | | 403/109.2 |
| 2017/0208942 A1* | 7/2017 | Chen | ............. | F16C 29/123 |
| 2018/0031037 A1* | 2/2018 | Chen | ............. | F16C 29/10 |

* cited by examiner

SLIDE RAIL DEVICE WITH UNLOCKING STRUCTURE FOR MIDDLE SLIDE RAIL

CROSS-REFERENCE TO RELATED PATENT APPLICATION

This application claims the benefit of priority to Taiwan Patent Application No. 106132274, filed on Sep. 20, 2017. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a slide rail device, and more particularly to a three-section type slide rail device having an unlocking function for a middle slide rail.

BACKGROUND OF THE DISCLOSURE

In general, most furniture such as desks, cabinets, or industrial computer cabinets, etc., are provided with slide rail devices, so that a movable member can be combined with a fixing member by using the slide rail devices. In order to improve the smoothness of the movable member during sliding, a three-section type slide rail device is developed, which includes an outer slide rail, a middle slide rail and an inner slide rail. The outer slide rail is fixedly mounted on the fixing member, such as a cabinet, and the inner slide rail is fixedly mounted on a side wall of the movable member, such as a server. In this case, the inner slide rail and the middle slide rail can be push or pulled reciprocally relative to the outer slide rail along the longitudinal direction of the three-section slide rail device. Therefore, the movable member can be pulled out or retracted relative to the fixing member.

In order to properly conduct the sliding operation of a conventional slide rail device, a locking mechanism is usually provided between the outer slide rail and the middle slide rail. When the slide rail device is pulled out, the middle slide rail can be fixed at an uttermost position by the locking mechanism. When the inner slide rail is retracted, the fixed state of the middle slide rail is released and can be pulled back synchronously. However, when the inner slide rail and the movable member, such as the server, are removed from the slide rail device, the middle slide rail that has been fixed in an extended state cannot be unlocked using the inner slide rail. At this time, the middle slide rail is exposed and protruded, which occupies outside space and may obstruct the closing of a door.

SUMMARY OF THE DISCLOSURE

In response to the above-referenced technical inadequacies, the present disclosure provides a slide rail device with an unlocking structure for a middle slide rail, so that the middle slide rail that has been fixed in position in the extended state can be unlocked to avoid an occurrence of the middle slide rail being exposed or protruded.

In one aspect, the present disclosure provides a slide rail device with an unlocking structure for a middle slide rail, which includes an outer slide rail, a middle slide rail, an inner slide rail, a ball bearing unit, an elastic locking element, and a releasing element. The outer slide rail is formed with an outer hook portion. The inner slide rail is coupled to the outer slide rail to enable the middle slide rail to be disposed between the outer slide rail and the inner slide rail. The ball bearing unit is disposed between the middle slide rail and the inner slide rail. The elastic locking element is disposed on the middle slide rail. The releasing element is movably disposed on the middle slide rail and is movable along a longitudinal direction of the slide rail device. The releasing element is arranged between the ball bearing unit and the elastic locking element. When the middle slide rail of the slide rail device is pulled out to a predetermined position, the elastic locking element and the outer hook portion are clamped to each other. When the inner slide rail is removed from the slide rail device, the ball bearing unit is configured to be capable of pushing the releasing element, and the releasing element pushes the elastic locking element to release the clamping relationship between the elastic locking element and the outer hook portion. Therefore, the middle slide rail that has been fixed in position in the extended state can be unlocked.

The present disclosure has advantages as follows. When the inner slide rail and a movable member are removed from the slide rail device, the ball bearing unit is configured to be capable of pushing the releasing element, and the releasing element pushes the elastic locking element to unlock the middle slide rail that has been fixed in position in the extended state. Therefore, the middle slide rail can avoid being exposed and protruded.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
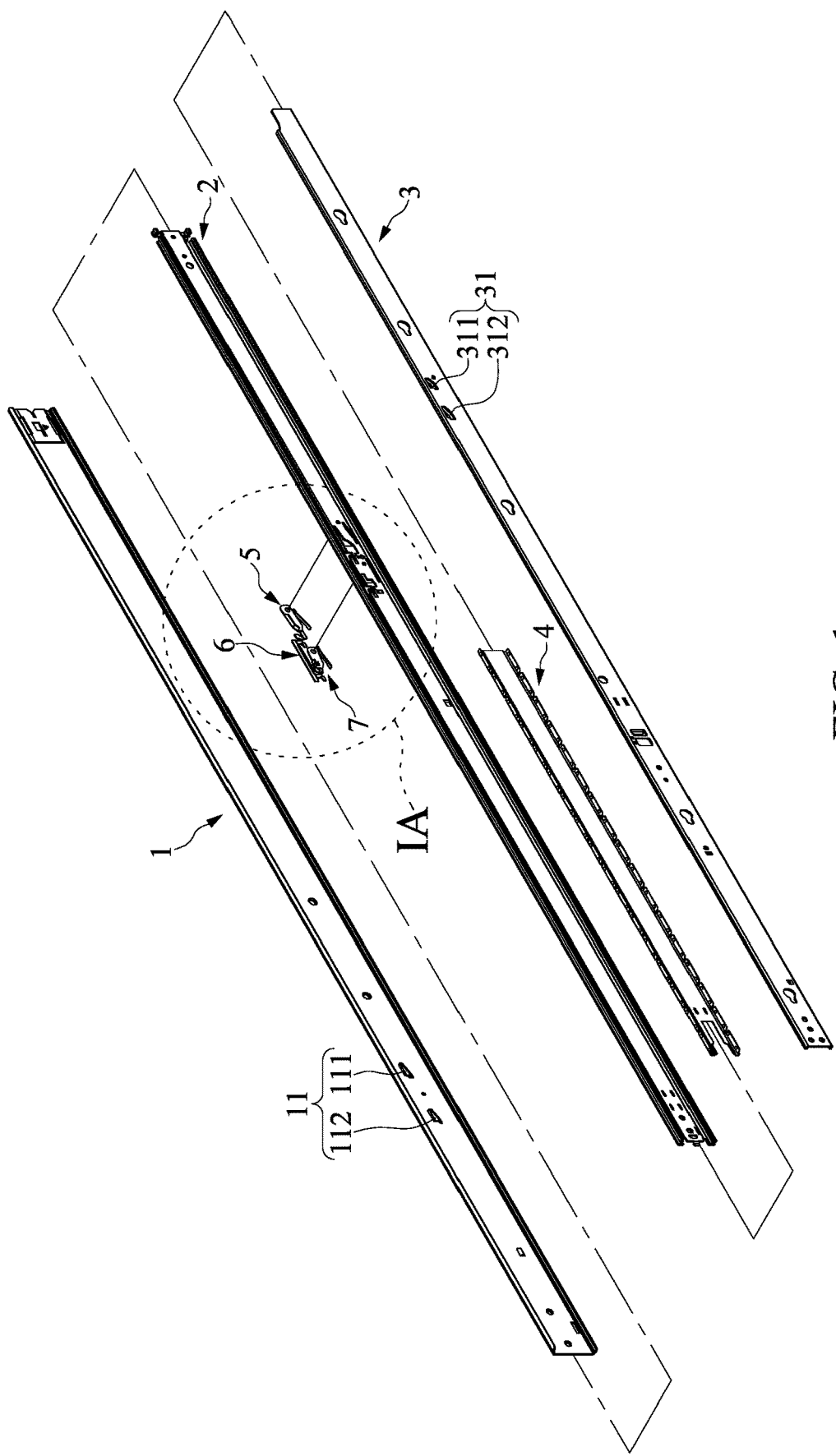
FIG. 1 is an exploded perspective view of a slide rail device of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
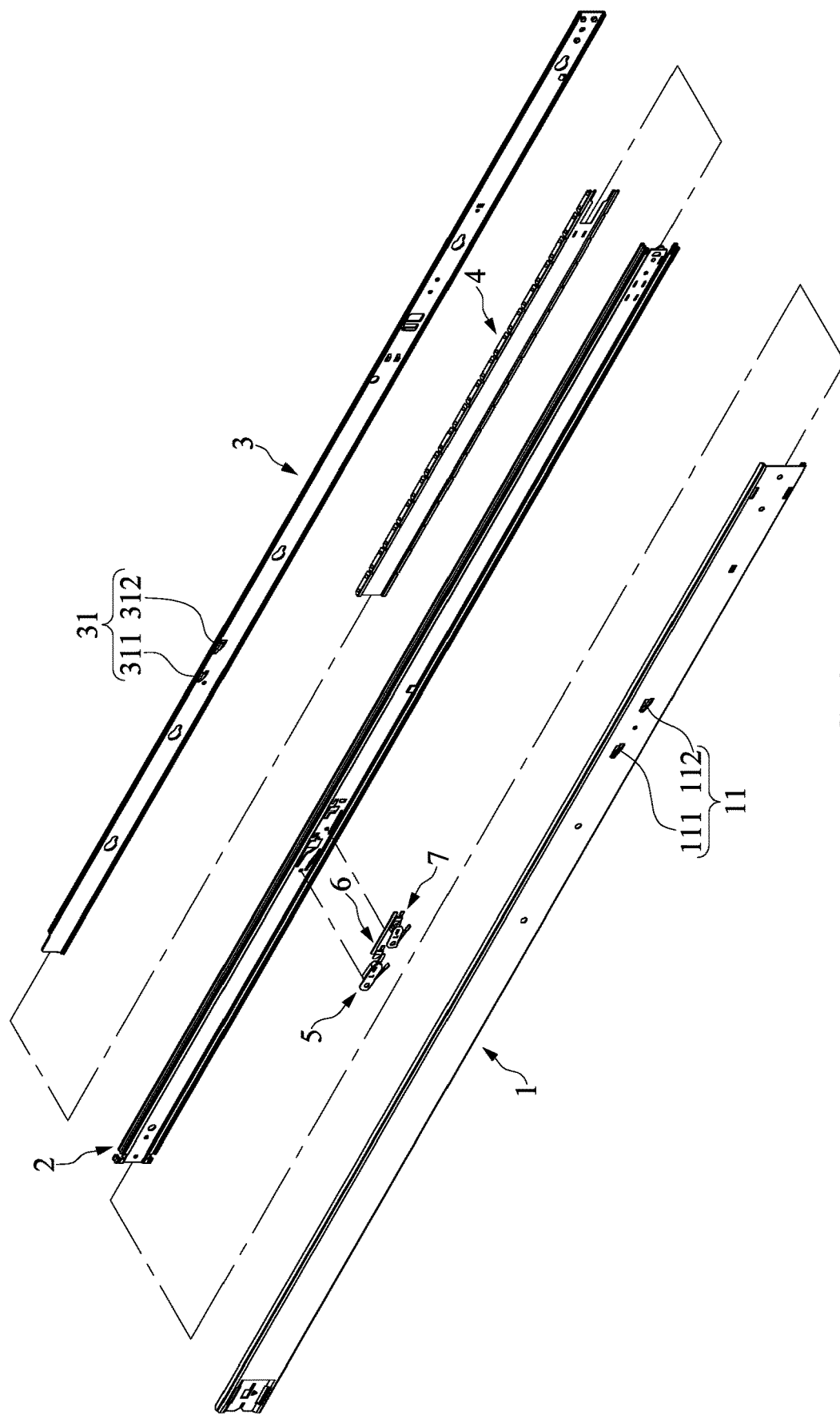
FIG. 2 is another exploded perspective view of the slide rail device of the present disclosure.
Figure 3:
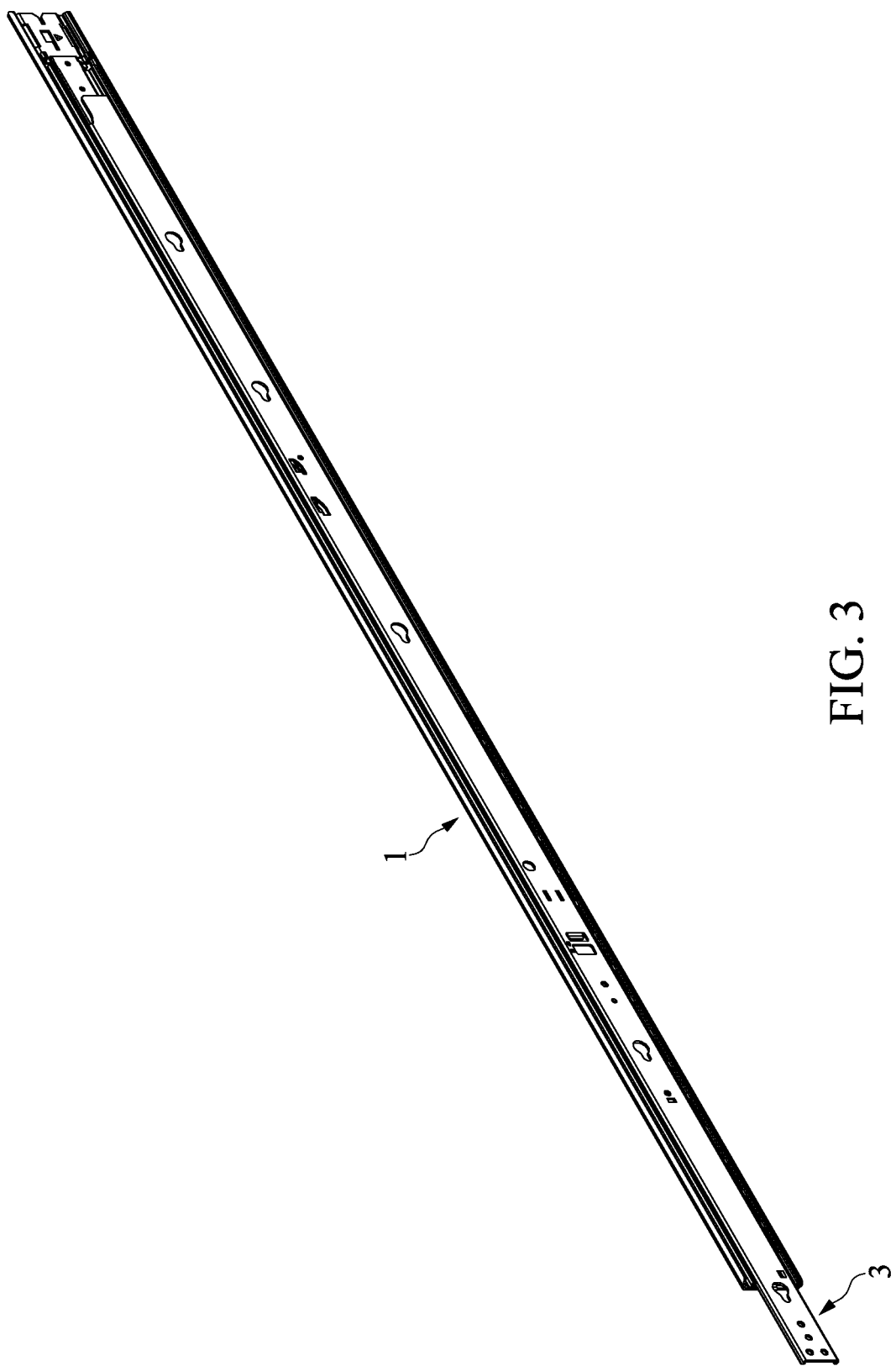
FIG. 3 is an assembled perspective view of the slide rail device of the present disclosure.

Reference is made to FIG. 1 to FIG. 2. The present disclosure provides a slide rail device with an unlocking structure for middle slide rail, which includes an outer slide rail 1, a middle slide rail 2, an inner slide rail 3, a ball bearing unit 4, an elastic locking element 5, and a releasing element 6. The slide rail device can further include an elastic synchronizing piece 7.

The outer slide rail 1 is fixedly mounted on a fixing member, such as a cabinet, and the inner slide rail 3 is fixedly mounted on a side wall of the movable member, such as a server. The middle slide rail 2 is disposed between the outer sliding slide rail 1 and the inner slide rail 3. The ball bearing unit 4 is arranged between the middle slide rail 2 and the inner slide rail 3. In this case, the inner slide rail 3 and the middle slide rail 2 can be pushed (that is, toward the left in FIG. 1) or pulled (that is, toward the right in FIG. 1) in a reciprocating manner relative to the outer slide rail 1 along the longitudinal direction of the slide rail device, thereby causing the movable member to be pulled out or gathered relative to the fixing member.

The elastic locking element 5 and the elastic synchronizing piece 7 are mounted on the middle slide rail 2. The outer sliding slide rail 1 is provided with an outer hook portion 11. The inner slide rail 3 is provided with an inner hook assembly 31. The outer hook group 11 and the inner hook group 31 can cooperate with the elastic locking element 5 and the elastic synchronizing piece 7 to perform corresponding operations. When the slide rail device is pulled outward or pushed inward, by the interrelated actuation of either action, the outer slide rail 1, the middle slide rail 2 and the inner slide rail 3 can be smoothly pulled outwardly or pushed inwardly in sequential and synchronized movements.

Further, the elastic locking element 5 is movably disposed on the middle slide rail 2. The elastic locking element 5 has a first elastic portion 51 and a first blocking portion 52, which are respectively disposed on a bottom side and a top side of the elastic locking element 5, and a first toggle lever 53 which is disposed on one end of the elastic locking element 5. The first elastic portion 51 is abutted against to the middle slide rail 2 to provide a force for the elastic locking element 5 to swing upward.

The elastic synchronizing piece 7 is pivotably mounted to one side of the middle slide rail 2, and the elastic synchronizing piece 7 and the elastic locking element 5 are spaced apart from each other. The elastic synchronizing piece 7 has a second elastic portion 71 and a second blocking portion 72 respectively disposed at the bottom side and the top side of the elastic synchronizing piece 7. One end of the elastic synchronizing piece 7 is provided with a second toggle lever 73. The second elastic portion 71 abuts against the middle slide rail 2 to provide a force for the elastic synchronizing piece 7 to swing upward. After the elastic synchronizing piece 7 and the elastic locking element 5 are fixedly coupled to the middle slide rail 2, a height of the first blocking portion 52 is different from a height of the second blocking portion 72 and has a step difference therebetween.

The inner hook assembly 31 has a first inner hook 311 and a second inner hook 312 that are spaced apart from each other. The first inner hook 311 and the second inner hook 312 are located at the same height position on one side wall of the inner slide rail 3, and the side wall of the inner slide rail 3 faces the elastic locking element 5 and the elastic synchronizing piece 7. The inner hook assembly 31 can move synchronously with the inner slide rail 3, and the elastic locking element 5 and the elastic synchronizing piece 7 work reciprocally with each other during the movement.

The outer hook portion 11 has a first outer hook 111 and a second outer hook 112, which are spaced apart from each other. The first outer hook 111 and the second outer hook 112 are respectively disposed at different height positions on one side wall of the outer slide rail 1 corresponding the height positions of the first blocking portion 52 and the second stopping portion 72, respectively. The outer hook portion 11 faces the elastic locking element 5 and the elastic synchronizing piece 7. The outer hook portion 11 is able to move together with the outer slide rail 1, and the outer hook portion 11, the elastic locking element 5 and the elastic synchronizing piece 7 work reciprocally with each other during the movement.

Figure 4A:
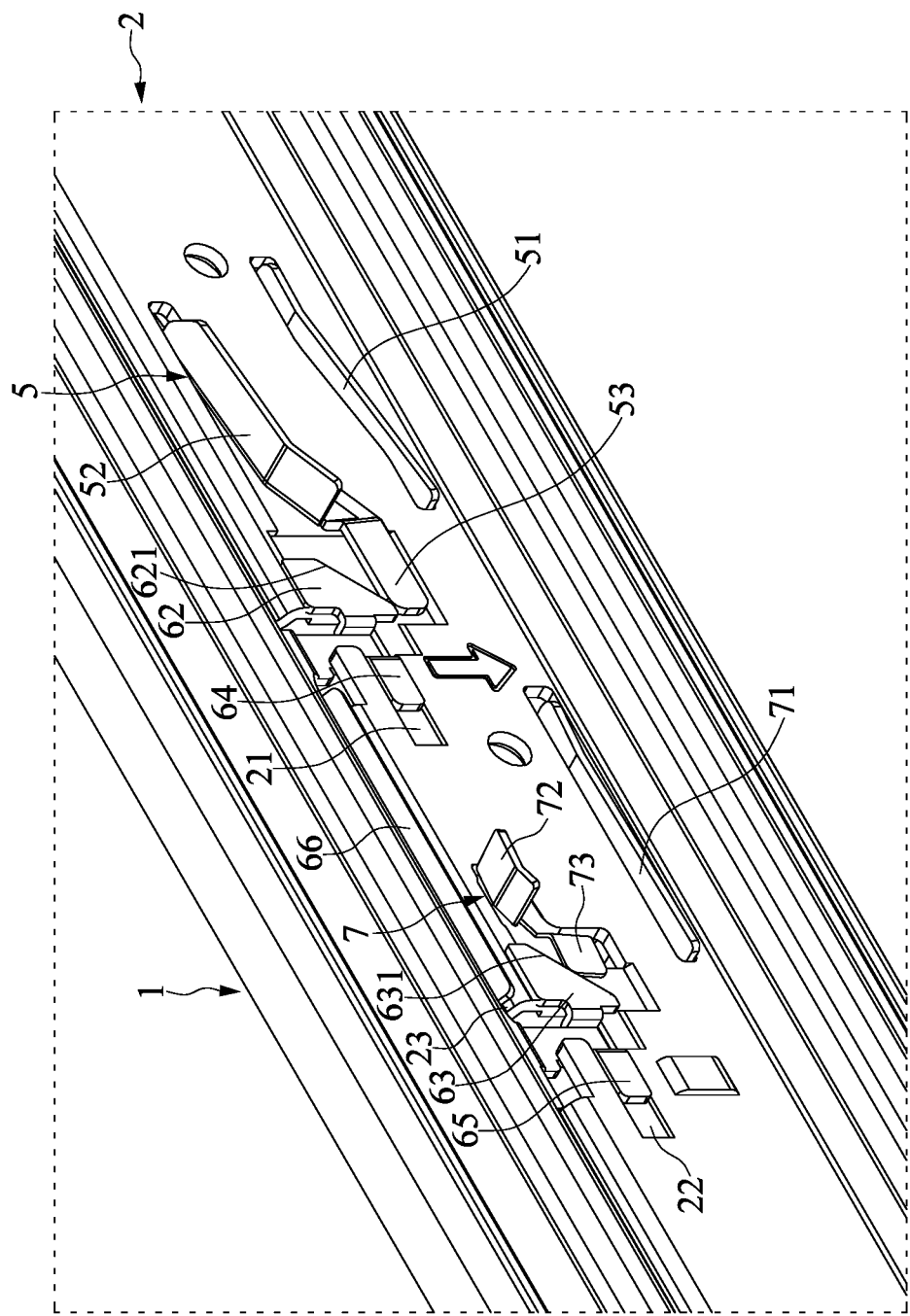
FIG. 4A is an enlarged partial view of the slide rail device showing an inner slide rail of the present disclosure being removed.
Figure 4B:
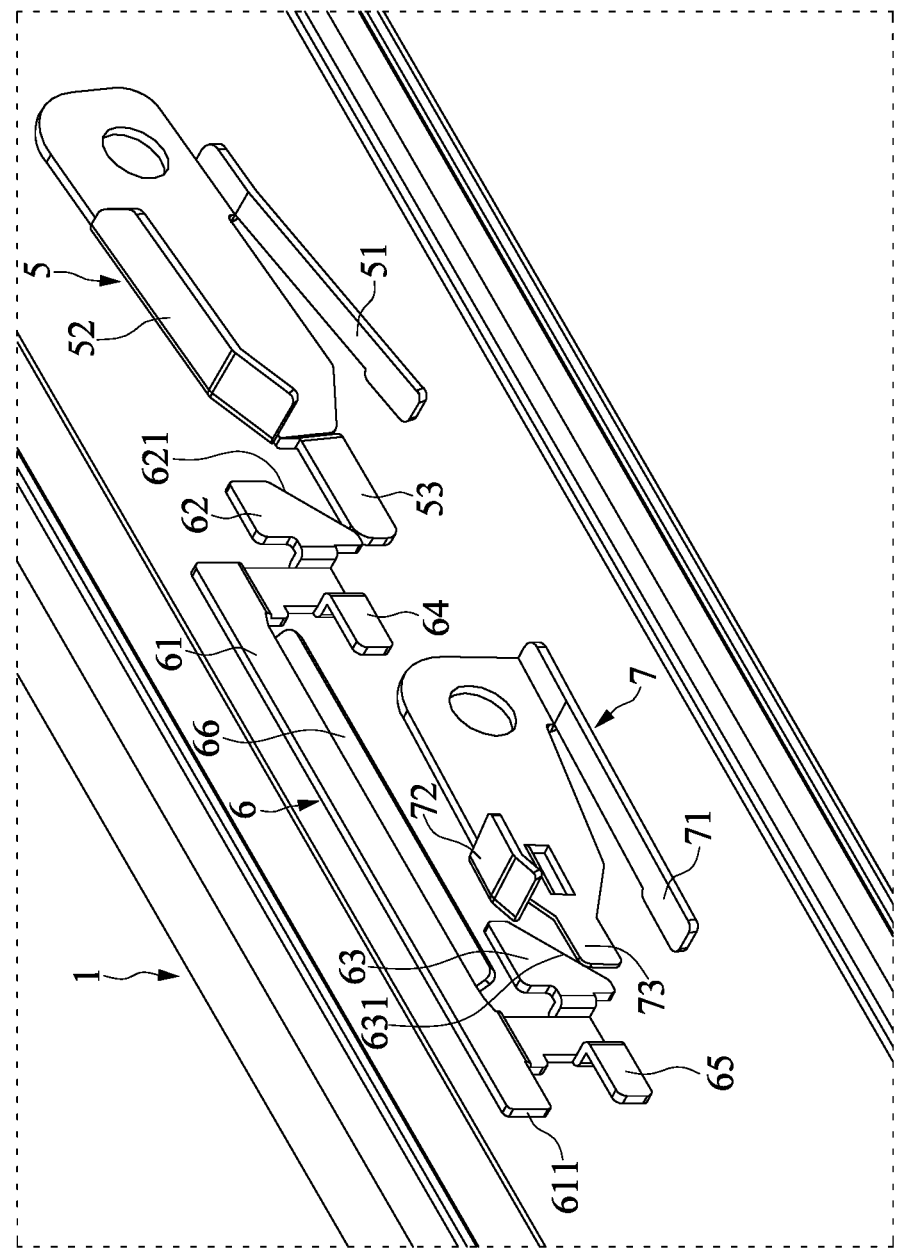
FIG. 4B is another enlarged partial view of the slide rail device showing a middle slide rail of the present disclosure being removed.
Figure 5:
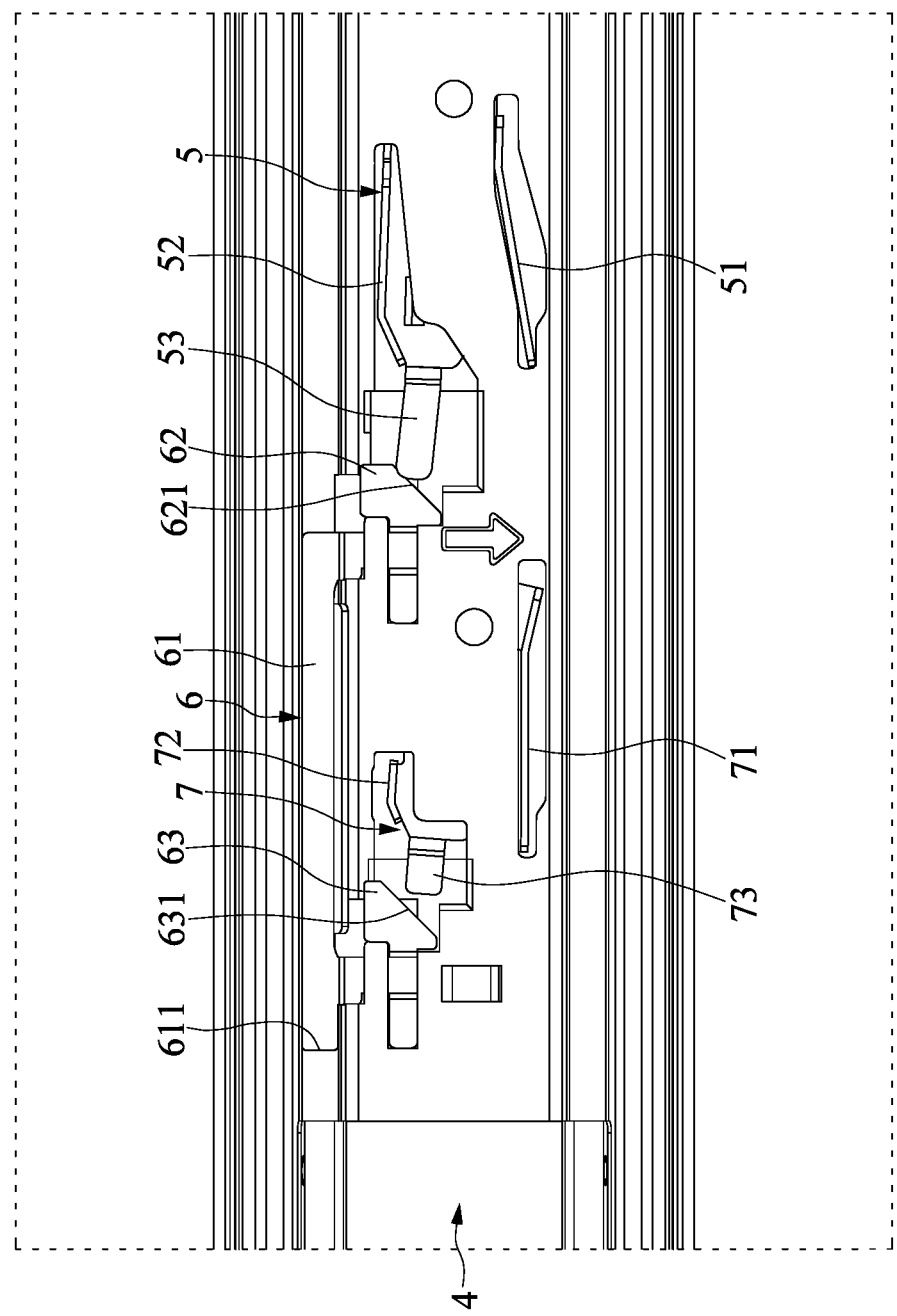
FIG. 5 is a planar schematic view illustrating an unactuated state of the slide rail device of the present disclosure.

The process of pulling the slide rail device outward is introduced as follows. Referring to FIG. 4A, FIG. 4B and FIG. 5. When the slide rail device is pulled outward, the second blocking portion 72 and the second toggle lever 73 swing upward by an elastic recovery force of the second elastic portion 71 of the elastic synchronizing piece 7. By this movement, the inner hook assembly 31 on the inner slide rail 3 and the second blocking portion 72 of the elastic synchronizing piece 7 are clamped to each other to form a limiting effect, so that the inner slide rail 3 and the middle slide rail 2 can move together. Then, the middle slide rail 2 and the inner slide rail 3 are pulled outward together away from the outer slide rail 1, until the first outer hook 111 and the second outer hook 112 of the outer hook portion 11 and the elastic locking element 5 and the elastic synchronizing piece 7 work reciprocally with each other. In this case, the first outer hook 111 will strike a beveled portion of the first blocking portion 52 of the elastic locking element 5, and the second outer hook 112 will strike a beveled portion of the second blocking portion 72 of the elastic synchronizing piece 7, so that the elastic locking element 5 and the elastic synchronizing piece 7 swing downward and clamp the first outer hook 111 and the second outer hook 112, and so that the restriction on the elastic locking element 5 and the elastic synchronizing piece 7, and the inner hook assembly 31 can be released. At this time, the middle slide rail 2 is fully expanded with respect to the outer slide rail 1, and since the restriction is released, the inner slide rail 3 can be pulled outward for a final distance relative to the middle slide rail 2.

The process of pushing the slide rail device inward is introduced as follows. After the slide rail device is pulled out, the outer hook portion 11 is clamped by the elastic locking element 5 and the elastic synchronizing piece 7 to form a limiting effect, so that the outer slide rail 1 and the middle slide rail 2 remain stationary, and the inner slide rail 3 is in a movable state relative to the middle slide rail 2. When pushing the slide rail device inward, the inner slide rail 3 is pushed inward related to the middle slide rail 2, that is, toward the left in FIG. 1. When the inner slide rail 3 is fully pushed to stay on one side of the middle slide rail 2, the inner hook assembly 31 activates the elastic locking element 5 and the elastic synchronizing piece 7, respectively. Therefore, the elastic locking element 5 and the elastic synchronizing piece 7 can be released from the restriction by the outer hook portion 11. Finally, the middle slide rail 2, being unrestricted, can be smoothly pushed inward into the inside of the outer slide rail 1 to complete the entire inward pushing action. In particular, the related structures and actuation relationships of the elastic locking element 5, the elastic synchronizing piece 7, the outer hook portion 11, and the inner hook part 31 are not the focus of the present disclosure and are not described in detail.

The releasing element 6 is movably disposed on the middle slide rail 2 and located between the pusher 4 and the elastic locking element 5, as shown in FIG. 4A. When the inner slide rail 3 and the movable member are removed from the rail assembly, the releasing element 6 can be pushed by the ball bearing unit 4, so that the releasing element 6 can push the elastic locking element 5 to release the elastic locking element 5 from the outer hook portion 11. The releasing element 6 can also push the elastic synchronizing piece 7 to release the elastic synchronizing piece 7 from the outer hook portion 11. Therefore, the middle slide rail 2, being unrestricted, can be smoothly pushed inward into the inside of the outer slide rail 1.

Figure 1A:
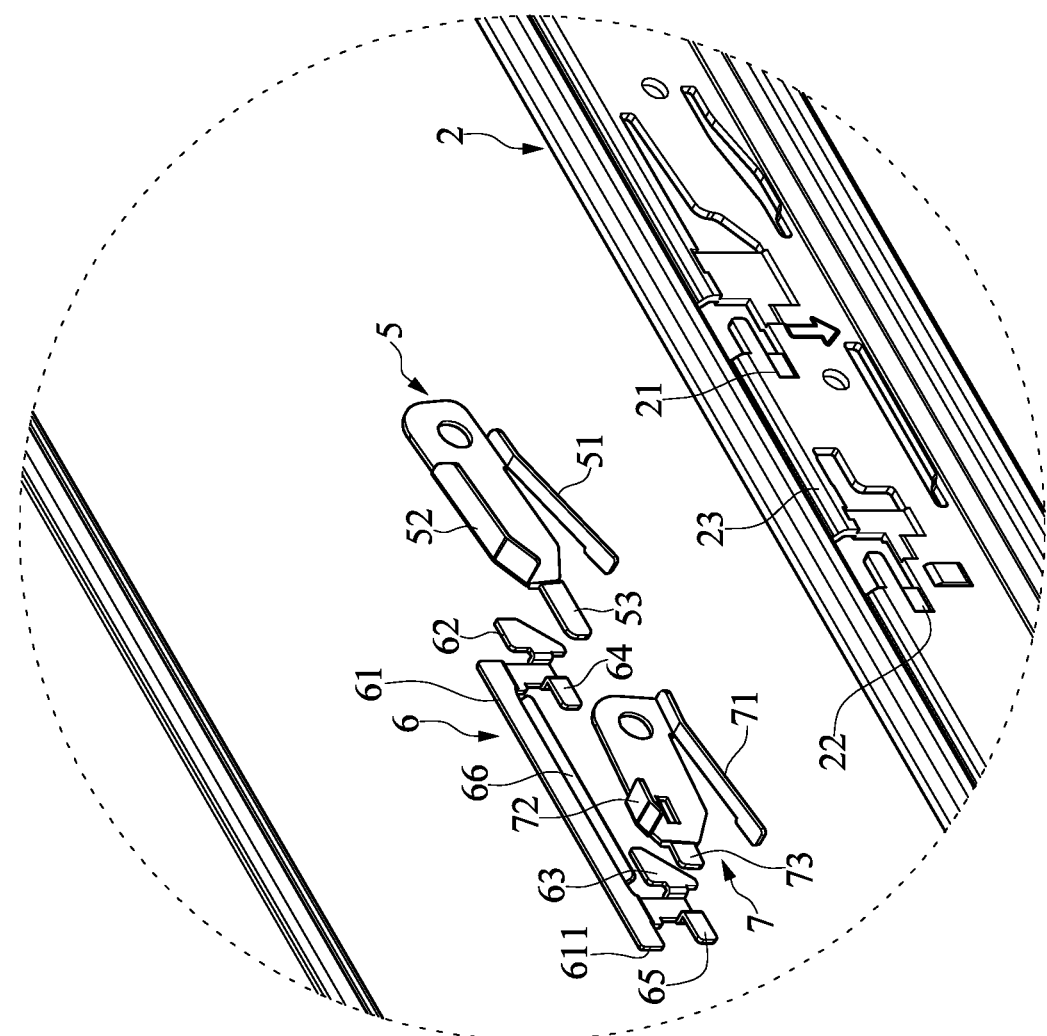
FIG. 1A is a partial enlarged view of section "IA" in FIG. 1.

Reference is made to FIG. 1A. In the above embodiments, the releasing element 6 is a metal plate member which is formed by stamping and bending a metal plate. The releasing element 6 has a rod body 61, and the rod body 61 rests against one side of the middle slide rail 2, and the releasing element 6 is movable on the middle slide rail 2 along the longitudinal direction of the slide rail device. The releasing element 6 further includes a first touch portion 62 connected to one end of the rod body 61. The first touch portion 62 is formed with a first oblique surface 621 which is located above the first toggle lever 53. The other end of the rod body 61 is formed with a contact end 611. Preferably, the contact end 611 has a vertical surface perpendicular to the longitudinal direction and faces the ball bearing unit 4. Furthermore, the other end of the rod body 61 is further provided with a second touch portion 63. The second touch portion 63 is provided with a second oblique surface 631, and the second oblique surface 631 is located above the second toggle lever 73.

The releasing element 6 further includes a first guiding piece 64 and a second guiding piece 65, which are respectively formed on two ends thereof. One side of the middle slide rail 2 is formed with a first guiding groove 21 and a second guiding groove 22. The first guide piece 64 is movably disposed in the first guiding groove 21, and the second guide piece 65 is movably disposed in the second guiding groove 22, so as to guide the releasing element 6 to move along the longitudinal direction of the slide rail device. A lower edge of the rod body 61 is formed with a first oblique plate 66. The middle slide rail 2 is formed with a second oblique plate 23. The first oblique plate 66 is movably disposed on the second oblique plate 23 for guiding the releasing element 6 to move along the longitudinal direction of the slide rail device.

Figure 6:
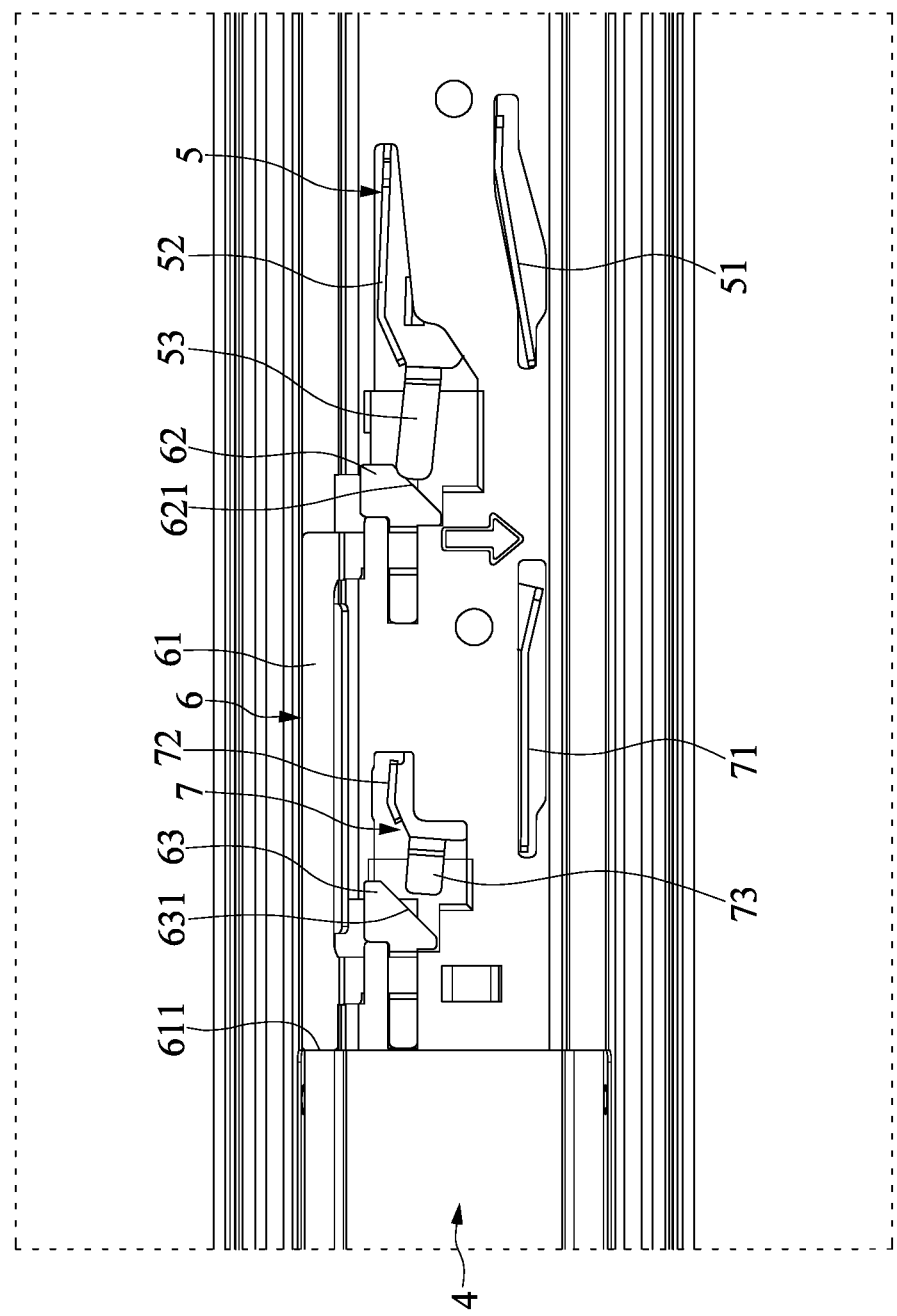
FIG. 6 is a planar schematic view illustrating a contact end near to and facing a ball bearing unit of the slide rail device of the present disclosure.
Figure 7:
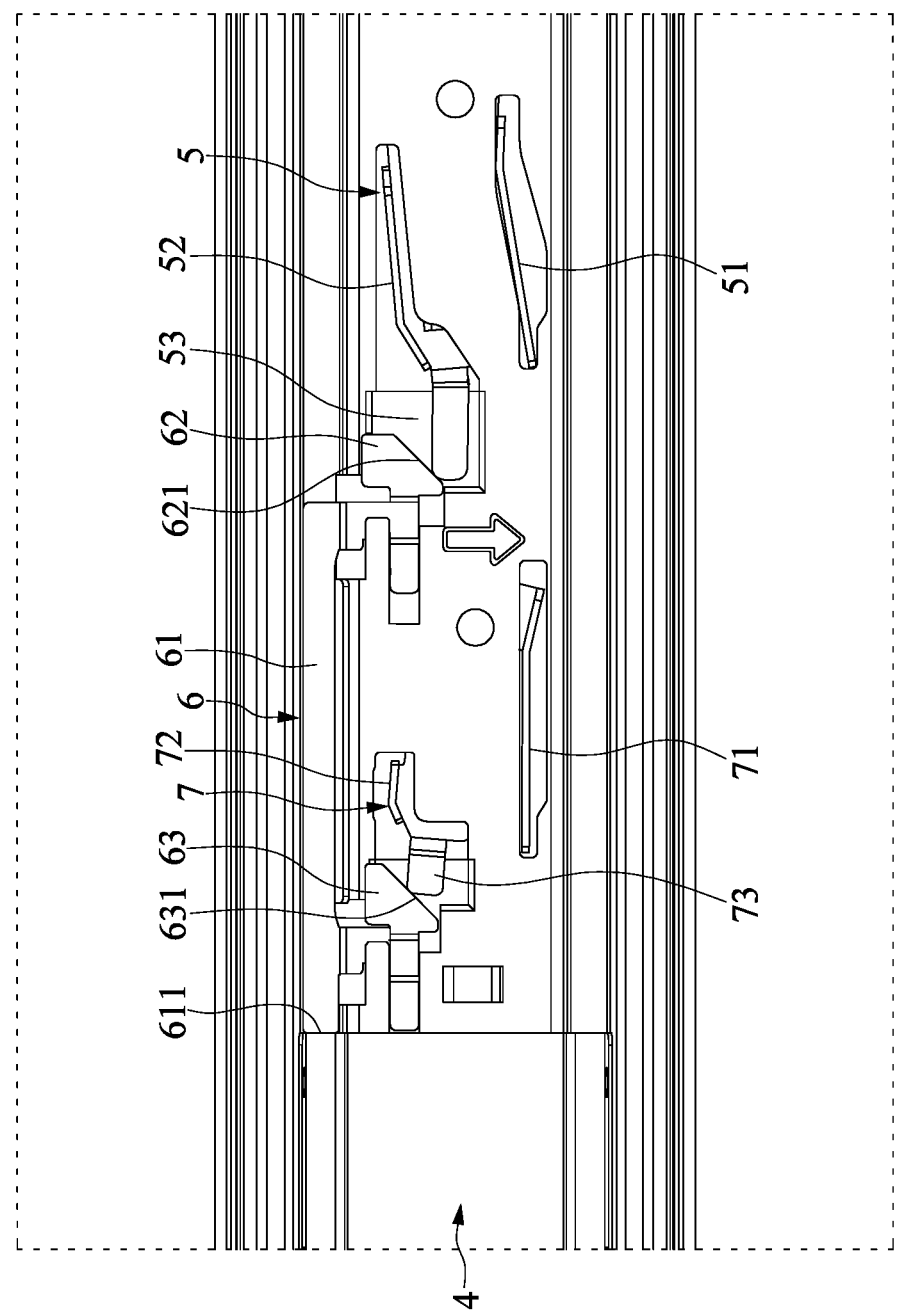
FIG. 7 is a planar schematic view illustrating a releasing element being pushed by the ball bearing unit and pushing an elastic locking element of the slide rail device of the present disclosure.
Figure 8:
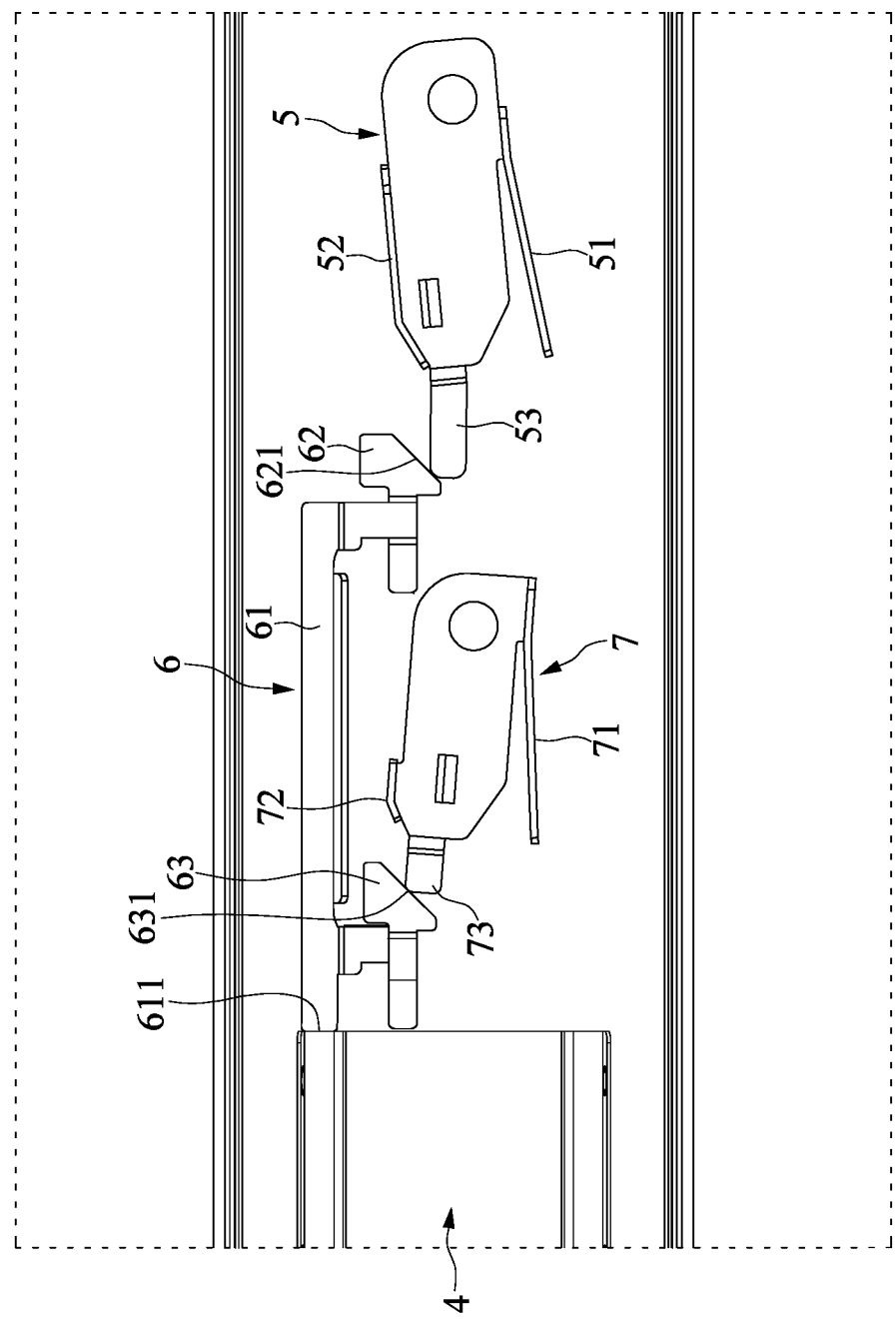
FIG. 8 is a planar schematic view illustrating a released and unlocked state of the slide rail device of the present disclosure.

Reference is made to FIG. 6. The ball bearing unit 4 can be pushed toward the releasing element 6, and the contact end 611 is close to and faces the ball bearing unit 4. Referring to FIG. 7, the ball bearing unit 4 is capable of pushing the releasing element 6. In detail, one end of the ball bearing unit 4 can abut against to the contact end 611 of the rod body 61, so that the releasing element 6 moves toward the elastic locking element 5. Reference is made to FIG. 8, which illustrates a released and unlock state of the slide rail device. The first toggle lever 53 of the elastic locking element 5 is pushed by the first oblique surface 621 of the first touch portion 62 to swing the elastic locking element 5 downward or counterclockwise, so that the elastic locking element 5 is released from a clamped relationship with the first outer hook 111 (as shown in FIG. 1) of the outer hook portion 11. Furthermore, the second oblique surface 631 of the second touch portion 63 pushes the second toggle lever 73 of the elastic synchronizing piece 7 to make the elastic synchronizing piece 7 swing downward, so that the elastic synchronizing piece 7 is released from a clamped relationship with the second outer hook 112 of the outer hook portion 11. Once the middle slide rail 2 is unrestricted, the middle slide rail 2 can be smoothly pushed inward into the inside of the outer slide rail 1.

The present disclosure provides a slide rail device with an unlocking structure for middle slide rail. When the inner slide rail and the movable member are removed from the slide rail device, the ball bearing unit is configured to push the releasing element, and the releasing element abuts against the elastic locking element to release the clamping relationship between the elastic locking element and the outer hook portion, so that the middle slide rail fixed in position in the extended state can be unlocked. Therefore, the middle slide rail can be prevented from being exposed and protruded.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A slide rail device with an unlocking structure for a middle slide rail, comprising:
   an outer slide rail provided with an outer hook portion;
   a middle slide rail;
   an inner slide rail coupled to the outer slide rail, and disposed between the outer slide rail and the inner slide rail;
   a ball bearing unit disposed between the middle slide rail and the inner slide rail;
   an elastic locking element disposed on the middle slide rail; and
   a releasing element movably disposed on the middle slide rail and being movable along a longitudinal direction of the slide rail device, wherein the releasing element is arranged between the ball bearing unit and the elastic locking element;
   wherein the releasing element has a rod body, the rod body rests against one side of the middle slide rail, and one end of the rod body is provided with a first touch portion, and the first touch portion is capable of pushing the elastic locking element to release the clamping between the elastic locking element and the outer hook portion;
   wherein the rod body has another end formed with a contact end, and the contact end has a vertical surface, and the contact end faces the ball bearing unit, so that the ball bearing unit is capable of pushing the contact end of the releasing element to cause the releasing element to push the elastic locking element;
   wherein when the slide rail device is pulled out and the middle slide rail is extended to a predetermined position, the elastic locking element and the outer hook portion are clamped to each other;
   wherein when the inner slide rail is removed from the slide rail device, the ball bearing unit is configured to push the releasing element, and the releasing element pushes the elastic locking element to release the clamping between the elastic locking element and the outer hook portion, so that the middle slide rail fixed in position in an extended state is capable of being unlocked.

2. The slide rail device with the unlocking structure for the middle slide rail according to claim 1, wherein the elastic locking element further includes a first elastic portion and a first blocking portion respectively disposed on a bottom side and a top side of the elastic locking piece, one end of the elastic locking element is provided with a first toggle lever, and the first elastic portion abuts against to the middle slide rail, and wherein the first touch portion is provided with a first oblique surface, and the first oblique surface is located above the first toggle lever, and the first oblique surface of the first touch portion is capable of pushing the first toggle lever of the elastic locking element, so that the elastic locking element swings downward to release the clamping between the elastic locking element and the outer hook portion.

3. The slide rail device with the unlocking structure for the middle slide rail according to claim 1, wherein the releasing element further includes a first guiding piece and a second guiding piece respectively disposed on two ends of the rod body, wherein the middle slide rail is formed with a first guiding groove and a second guiding groove on one side thereof, and wherein the first guide piece is movably disposed in the first guiding groove, and the second guide piece is movably disposed in the second guiding groove, so as to guide the releasing element to move along the longitudinal direction of the slide rail device.

4. The slide rail device with the unlocking structure for the middle slide rail according to claim 1, wherein the releasing element further includes a first oblique plate connected with a lower edge of the rod body, and a second oblique plate formed on the middle slide rail, and wherein the first oblique plate is movably disposed on the second oblique plate for guiding the releasing element to move along the longitudinal direction of the slide rail device.

5. The slide rail device with the unlocking structure for the middle slide rail according to claim 1, wherein the releasing element is a metal plate.

6. The slide rail device with the unlocking structure for the middle slide rail according to claim 1, further comprising an elastic synchronizing piece movably connected to one side of the middle slide rail in a pivotal manner, wherein the elastic synchronizing piece has a second elastic portion and a second blocking portion respectively disposed on a bottom side and a top side of the elastic synchronizing piece, one end of the elastic synchronizing piece is provided with a second toggle lever, and the second elastic portion abuts against the middle slide rail, and wherein another end of the rod body is formed with a second touch portion, the second touch portion is provided with a second oblique surface, the second oblique surface is located above the second toggle lever, and the second oblique surface of the second touch portion is capable of pushing the second toggle lever of the elastic synchronizing piece, so that the elastic synchronizing piece swings downward to release a clamping relationship between the elastic locking element and the outer hook portion.

7. A slide rail device with an unlocking structure for a middle slide rail, comprising:
   an outer slide rail provided with an outer hook portion;
   a middle slide rail;
   an inner slide rail coupled to the outer slide rail, and disposed between the outer slide rail and the inner slide rail;
   a ball bearing unit disposed between the middle slide rail and the inner slide rail;
   an elastic locking element disposed on the middle slide rail; and
   a releasing element movably disposed on the middle slide rail and being movable along a longitudinal direction of the slide rail device, wherein the releasing element is arranged between the ball bearing unit and the elastic locking element;
   wherein the releasing element has a rod body, the rod body rests against one side of the middle slide rail, and one end of the rod body is provided with a first touch portion, and the first touch portion is capable of pushing the elastic locking element to release the clamping between the elastic locking element and the outer hook portion;
   wherein the releasing element further includes a first guiding piece and a second guiding piece respectively disposed on two ends of the rod body, wherein the middle slide rail is formed with a first guiding groove and a second guiding groove on one side thereof, and wherein the first guide piece is movably disposed in the first guiding groove, and the second guide piece is movably disposed in the second guiding groove, so as to guide the releasing element to move along the longitudinal direction of the slide rail device;

wherein when the slide rail device is pulled out and the middle slide rail is extended to a predetermined position, the elastic locking element and the outer hook portion are clamped to each other;

wherein when the inner slide rail is removed from the slide rail device, the ball bearing unit is configured to push the releasing element, and the releasing element pushes the elastic locking element to release the clamping between the elastic locking element and the outer hook portion, so that the middle slide rail fixed in position in an extended state is capable of being unlocked.

8. The slide rail device with the unlocking structure for the middle slide rail according to claim 7, wherein the elastic locking element further includes a first elastic portion and a first blocking portion respectively disposed on a bottom side and a top side of the elastic locking piece, one end of the elastic locking element is provided with a first toggle lever, and the first elastic portion abuts against to the middle slide rail, and wherein the first touch portion is provided with a first oblique surface, and the first oblique surface is located above the first toggle lever, and the first oblique surface of the first touch portion is capable of pushing the first toggle lever of the elastic locking element, so that the elastic locking element swings downward to release the clamping between the elastic locking element and the outer hook portion.

9. The slide rail device with the unlocking structure for the middle slide rail according to claim 7, wherein the releasing element is a metal plate.

10. The slide rail device with the unlocking structure for the middle slide rail according to claim 7, further comprising an elastic synchronizing piece movably connected to one side of the middle slide rail in a pivotal manner, wherein the elastic synchronizing piece has a second elastic portion and a second blocking portion respectively disposed on a bottom side and a top side of the elastic synchronizing piece, one end of the elastic synchronizing piece is provided with a second toggle lever, and the second elastic portion abuts against the middle slide rail, and wherein another end of the rod body is formed with a second touch portion, the second touch portion is provided with a second oblique surface, the second oblique surface is located above the second toggle lever, and the second oblique surface of the second touch portion is capable of pushing the second toggle lever of the elastic synchronizing piece, so that the elastic synchronizing piece swings downward to release a clamping relationship between the elastic locking element and the outer hook portion.

11. A slide rail device with an unlocking structure for a middle slide rail, comprising:
an outer slide rail provided with an outer hook portion;
a middle slide rail;
an inner slide rail coupled to the outer slide rail, and disposed between the outer slide rail and the inner slide rail;
a ball bearing unit disposed between the middle slide rail and the inner slide rail;
an elastic locking element disposed on the middle slide rail; and
a releasing element movably disposed on the middle slide rail and being movable along a longitudinal direction of the slide rail device, wherein the releasing element is arranged between the ball bearing unit and the elastic locking element;
wherein the releasing element has a rod body, the rod body rests against one side of the middle slide rail, and one end of the rod body is provided with a first touch portion, and the first touch portion is capable of pushing the elastic locking element to release the clamping between the elastic locking element and the outer hook portion;

wherein the releasing element further includes a first oblique plate connected with a lower edge of the rod body, and a second oblique plate formed on the middle slide rail, and wherein the first oblique plate is movably disposed on the second oblique plate for guiding the releasing element to move along the longitudinal direction of the slide rail device;

wherein when the slide rail device is pulled out and the middle slide rail is extended to a predetermined position, the elastic locking element and the outer hook portion are clamped to each other;

wherein when the inner slide rail is removed from the slide rail device, the ball bearing unit is configured to push the releasing element, and the releasing element pushes the elastic locking element to release the clamping between the elastic locking element and the outer hook portion, so that the middle slide rail fixed in position in an extended state is capable of being unlocked.

12. The slide rail device with the unlocking structure for the middle slide rail according to claim 11, wherein the elastic locking element further includes a first elastic portion and a first blocking portion respectively disposed on a bottom side and a top side of the elastic locking piece, one end of the elastic locking element is provided with a first toggle lever, and the first elastic portion abuts against to the middle slide rail, and wherein the first touch portion is provided with a first oblique surface, and the first oblique surface is located above the first toggle lever, and the first oblique surface of the first touch portion is capable of pushing the first toggle lever of the elastic locking element, so that the elastic locking element swings downward to release the clamping between the elastic locking element and the outer hook portion.

13. The slide rail device with the unlocking structure for the middle slide rail according to claim 11, wherein the releasing element is a metal plate.

14. The slide rail device with the unlocking structure for the middle slide rail according to claim 11, further comprising an elastic synchronizing piece movably connected to one side of the middle slide rail in a pivotal manner, wherein the elastic synchronizing piece has a second elastic portion and a second blocking portion respectively disposed on a bottom side and a top side of the elastic synchronizing piece, one end of the elastic synchronizing piece is provided with a second toggle lever, and the second elastic portion abuts against the middle slide rail, and wherein another end of the rod body is formed with a second touch portion, the second touch portion is provided with a second oblique surface, the second oblique surface is located above the second toggle lever, and the second oblique surface of the second touch portion is capable of pushing the second toggle lever of the elastic synchronizing piece, so that the elastic synchronizing piece swings downward to release a clamping relationship between the elastic locking element and the outer hook portion.

* * * * *